United States Patent [19]

Parks et al.

[11] Patent Number: 5,432,735
[45] Date of Patent: Jul. 11, 1995

[54] TERNARY STORAGE DYNAMIC RAM

[75] Inventors: Terry Parks, Round Rock; Darius D. Gaskins, Austin, both of Tex.

[73] Assignee: Dellusa, L.P., Austin, Tex.

[21] Appl. No.: 89,165

[22] Filed: Jul. 8, 1993

[51] Int. Cl.$^6$ ............................. G11B 5/09; G11C 7/00
[52] U.S. Cl. ................................. 365/168; 365/189.01
[58] Field of Search ................... 365/168, 222, 189.01, 365/230

[56] References Cited

U.S. PATENT DOCUMENTS

| | | | |
|---|---|---|---|
| 4,482,927 | 11/1984 | Melbye et al. | 360/40 |
| 4,771,404 | 9/1988 | Mano et al. | 365/222 |
| 5,148,333 | 9/1992 | Shinpuku | 360/40 |
| 5,262,984 | 11/1993 | Noguchi et al. | 365/185 |

Primary Examiner—Viet Q. Nguyen
Attorney, Agent, or Firm—Jeff Hood; James Huffman

[57] ABSTRACT

A memory apparatus using conventional DRAMs which uses a ternary representation of stored data. Each DRAM memory cell can thus store three states. The ternary storage memory apparatus includes a binary to ternary converter which receives a first number of binary bits of data during a write operation and generates a second lesser number of data values or voltages using a ternary representation. A second number of memory storage elements are coupled to the binary to ternary converter and store the respective voltage using the above ternary representation. During reads, a ternary to binary converter reads the voltages stored in the memory elements and converts these voltages into the original first number of binary bits that were originally written into the memory storage elements. This allows the use of existing DRAM while considerably increasing the DRAM's memory storage density.

13 Claims, 5 Drawing Sheets

| $T_{01}$ | $T_{00}$ | $BL_1$ |
|---|---|---|
| 0 | 0 | VSS |
| 0 | 1 | +VDD |
| 1 | 0 | −VDD |
| 1 | 1 | OPEN |

BINARY TO TERNARY ENCODING

| BINARY NUMBER | TERNARY NUMBER |
|---|---|
| 0000 | 111 |
| 0001 | 112 |
| 0010 | 121 |
| 0011 | 122 |
| 0100 | 211 |
| 0101 | 212 |
| 0110 | 221 |
| 0111 | 222 |
| 1000 | 011 |
| 1001 | 012 |
| 1010 | 021 |
| 1011 | 022 |
| 1100 | 110 |
| 1101 | 210 |
| 1110 | 120 |
| 1111 | 220 |

FIG. 5

TERNARY STORAGE DYNAMIC RAM

SPECIFICATION

1. Field of the Invention

The present invention relates to memory storage in computer systems, and more specifically to a method and apparatus for enabling standard binary memory cells to use a ternary representation of stored data, thus increasing memory storage density.

2. Description of the Related Art

Computer systems are being called upon to store increasingly larger amounts of data and thus have increased memory requirements. A typical computer system includes between 2 and 6 Mbytes of RAM (random access memory) which is generally comprised of DRAM or dynamic RAM. A computer's RAM essentially acts as a scratchpad for use by the computer's microprocessor. RAM is used to store code or application programs that are being executed by the microprocessor as well as the data generated by the microprocessor as a result of code execution. A computer system also typically includes a hard drive having up to 100 or more Mbytes of storage. A hard drive is a magnetic media that usually acts as the principal mass storage system. For example, a computer's hard drive typically stores all of the computer's application programs, and the application program that is in use is loaded in the computer's RAM for execution.

The amount of RAM available in a computer system affects the type of application programs that can be executed as well as the speed with which an application program can be executed. For example, certain application programs require a minimum amount of computer memory before they can be run. Also, a computer system running a large application program with insufficient RAM is generally required to swap data in and out of the hard disk during code execution. This significantly reduces computer performance.

New software applications are being developed for computer systems which require larger memory requirements. For example, the move toward graphical user interfaces (GUIs), as well as multi-media applications, requires much larger amounts of memory to store the required graphical data. Another factor involved with memory storage in computer systems is cost. A computer system's main memory or DRAM is typically among the greatest cost factors in a computer system. This cost factor typically requires users to sacrifice the power and performance of a computer system by limiting the amount of computer RAM. Therefore, a method and apparatus is desired which increases the storage density of current computer memory such as DRAMs, thus providing increased memory storage at a similar cost.

Current data storage devices or memory systems use a binary representation of stored data. In other words, data is stored in memory as either a series of on/offs or 1's and 0's. For example, in a magnetic media such as a disk drive, data is stored by either the presence or absence of magnetic charges on the media. In dynamic random access memory (DRAM), data is stored by either the presence or absence of a charge on a capacitor. For example, current DRAMs use lack of charge or 0 volts to represent a 0 value and a charge of +5 volts to represent a one value. However, the capacitor in a DRAM cell is capable of storing a plurality of charge levels. Therefore, a method and apparatus is desired which increases the storage density of DRAMs while maintaining compatibility with current binary computer systems.

SUMMARY OF THE INVENTION

The invention comprises a memory apparatus using conventional DRAMs which uses a ternary representation of stored data. Each DRAM memory cell can thus store three states. In the preferred embodiment, the external representation of data used by the computer system can be partitioned into four binary bit blocks of data, which can represent 16 different states. These four binary bits are stored in memory using three DRAM cells having three states which thus can represent 27 different states. This results in a 33% storage density increase using standard DRAM cells.

The ternary storage memory apparatus includes a binary to ternary converter which receives a first number of binary bits of data during a write operation and generates a second lesser number of data values using a ternary representation. The binary to ternary converter includes a binary to ternary encoder which produces a second number of two bit values which are then transformed by bit line drivers into a second number of values each having one of three voltages referred to as VSS, +VDD, and −VDD. A second number of memory storage elements are coupled to the binary to ternary converter and store the respective voltages using the above ternary representation. During reads, a ternary to binary converter comprising sense amplifiers and a ternary to binary decoder reads the voltages stored in the respective memory elements and recreates the original binary data. The sense amplifiers coupled to the respective memory storage elements read the voltages stored in the respective memory elements and convert these voltages into a second number of two bit values. The ternary to binary decoder converts these second number of two bit values into the original first number of binary bits that were originally written into the memory storage elements.

Therefore, a method for using standard DRAM cells to store data values using a ternary representation of data is disclosed. This allows the use of existing DRAM while considerably increasing the DRAM's memory storage density.

BRIEF DESCRIPTION OF THE DRAWINGS

A better understanding of the present invention can be obtained when the following detailed description of the preferred embodiment is considered in conjunction with the following drawings, in which:

FIG. 5 illustrates the binary to ternary encoding scheme of the preferred embodiment.

DETAILED DESCRIPTION OF THE PREFERRED EMBODIMENT

Figure 1:
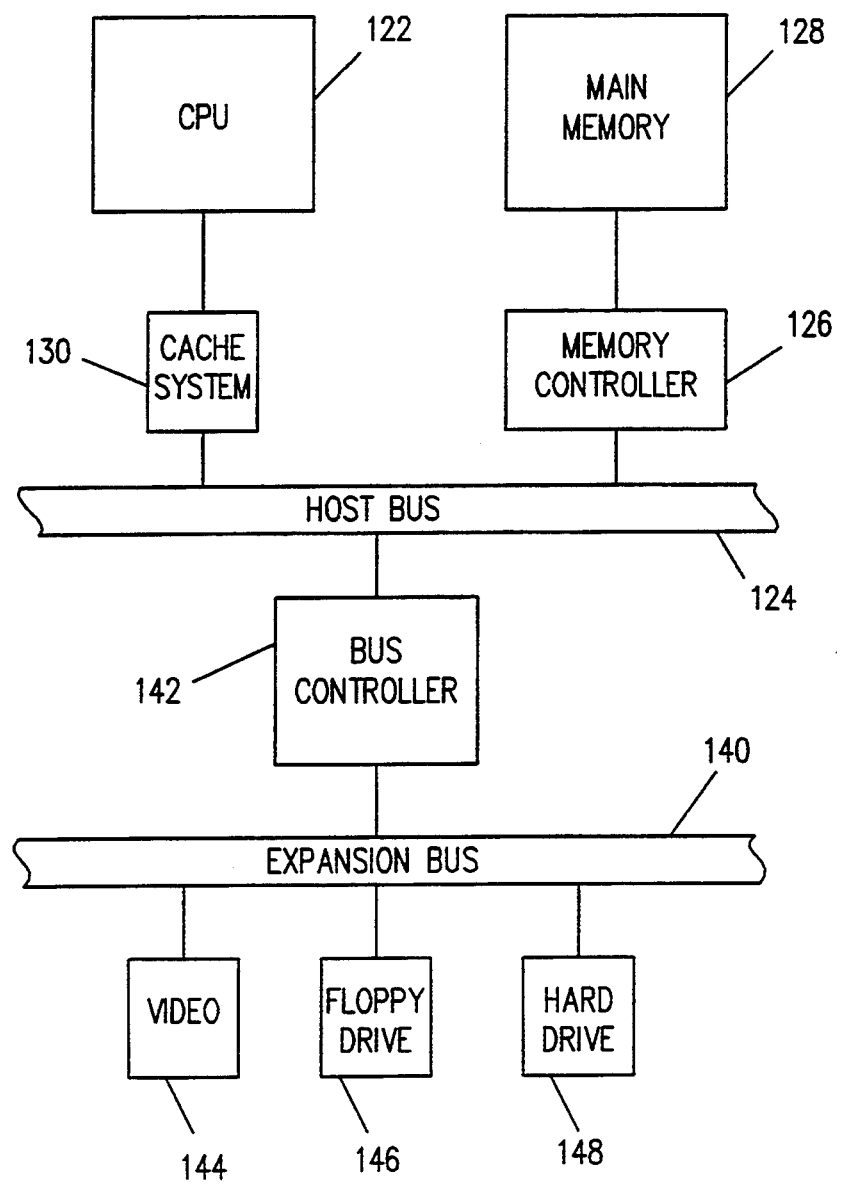
FIG. 1 is a block diagram illustrating a computer system according to one embodiment of the invention.

Referring now to FIG. 1, a computer system incorporating logic according to the present invention is shown. The elements of a computer system not necessary to understand the operation of the present invention have been omitted for simplicity. The computer system includes a central processing unit or CPU 122 which is coupled to a memory or host bus 124. A CPU cache system 130 is preferably coupled between the CPU 122 and the host bus 124. The cache system 130 comprises cache memory and a cache controller.

The host bus 124 includes address, data, and control portions. Main memory 128 is coupled to the host bus 124 by means of memory controller 126. The host bus 124 is coupled to an expansion or input/output (I/O) bus 140 by means of a bus controller 142. The expansion bus 140 includes slots for various other devices, including video 144, a floppy drive 146 and hard drive 148, as desired.

The main memory 128 is comprised of dynamic random access memory (DRAM) cells and includes logic according to the present invention which enables a ternary representation of stored data using standard binary DRAM cells. This results in a significant storage density increase. In the following description, main memory 128 is also referred to as the ternary DRAM or ternary memory. It is also noted that a representation of data using a greater number of states, such as a quaternary representation of stored data, is also contemplated.

Figure 2:
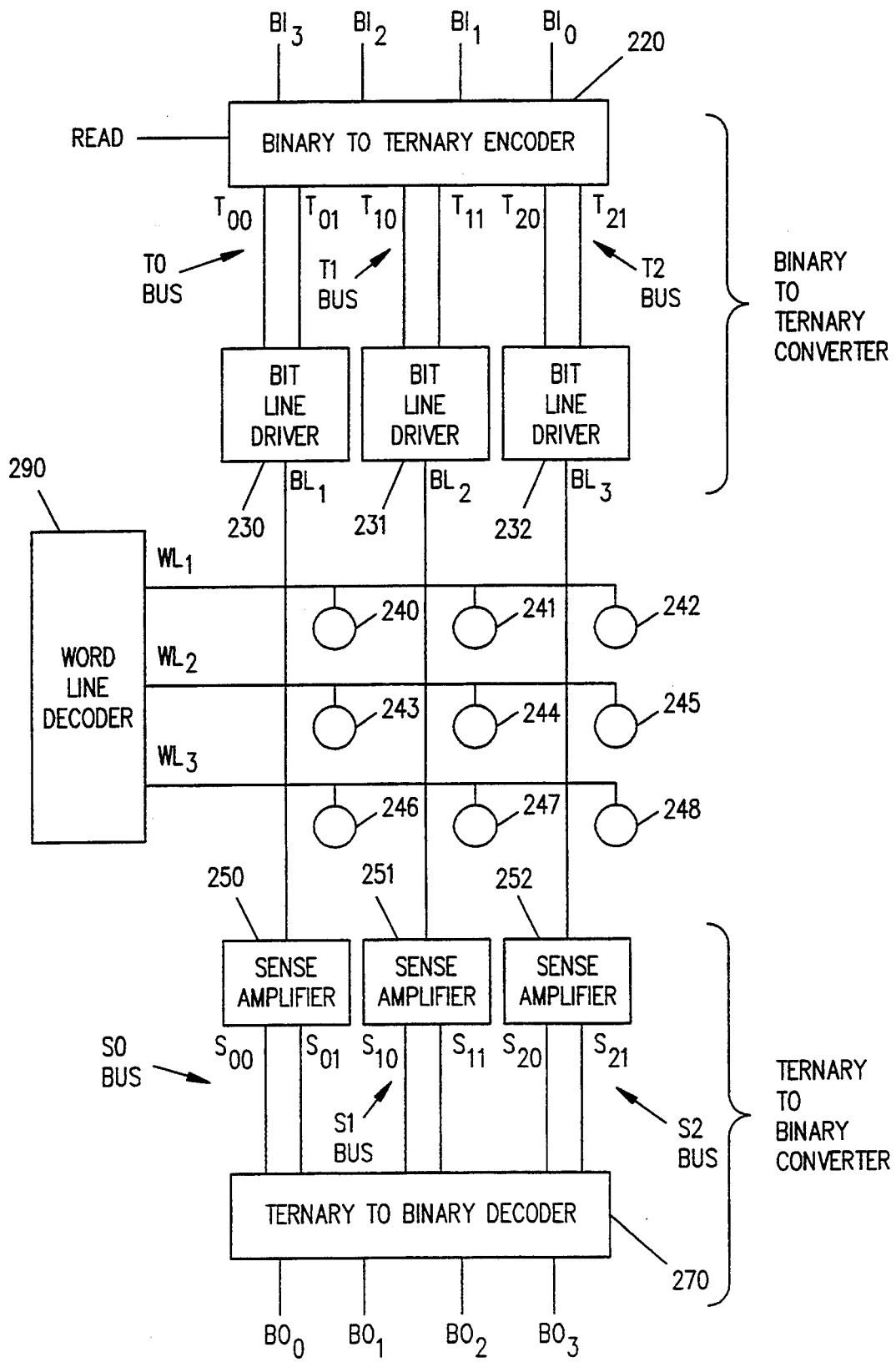
FIG. 2 is a block diagram illustrating a portion of the ternary DRAM of the present invention.

Referring now to FIG. 2, a portion of the ternary DRAM according to the preferred embodiment of the invention is shown. FIG. 2 illustrates the DRAM cells and logic associated with three bit lines and three word lines of the DRAM for illustrative purposes. However, it is noted that the remainder of the DRAM array can be constructed by replicating these three bit lines and three word lines and their corresponding logic to achieve the row and column widths desired.

The portion of memory shown in FIG. 2 includes four bit lines, $BI_3$, $BI_2$, $BI_1$ and $BI_0$ which provide binary data to the ternary DRAM. Each of these bit lines provide their respective bit values to a binary to ternary converter which comprises a binary to ternary encoder 220 and bit line drivers 230, 231, and 232. As shown in FIG. 5, the binary to ternary encoder 220, in conjunction with bit line drivers 230, 231, and 232, operates to encode the four binary values $BI_0$ to $BI_3$ into a ternary representation using three values. It is noted that there are various, binary to ternary encodings possible.

Referring again to FIG. 2, the binary to ternary encoder 220 encodes the four binary values $BI_0$ to $BI_3$ into three two bit buses referred to as $T_0$, $T_1$, and $T_2$. The two bit bus $T_0$ comprises two lines referred to as $T_{00}$ and $T_{01}$, the two bit bus $T_1$ comprises two lines referred as $T_{10}$ and $T_{11}$, and the two bit bus $T_2$ comprises two lines referred as $T_{20}$ and $T_{21}$. What follows is a VHDL description of the operation of the binary to ternary encoder 220 in encoding the signals $BI_3$, $BI_2$, $BI_1$ and $BI_0$ into the two bit buses $T_0$, $T_1$ and $T_2$:

```
T2 <=  '11' when read = 1 else
       '00' when BI(3 downto 2) = '11' else
       '01' when BI(0) = '1' else
       '10';
T1 <=  '11' when read = 1 else
       '01' when BI(1) = '1' else
       '10';
T0 <=  '11' when read = 1 else
       '00' when BI(3 downto 2) = '10' else
       '01' when BI(3 downto 2) = '01' else
       '01' when BI = '1101' else
       '01' when BI = '1111' else
```

-continued
```
       '10'
```

The code used above was chosen to minimize the number of zeros in the code because, in general, they are sensed less reliably by sense amplifiers 250, 251, and 252, which are described below. However, it is noted that various types of encodings may be used.

The two bits from each of the buses $T_0$, $T_1$ and $T_2$ are provided to inputs of respective bit line drivers 230, 231 and 232, as shown. Bit line drivers 230, 231 and 232 receive the two bit values from the buses $T_0$, $T_1$, and $T_2$ and generate one of three different voltages, VSS, +VDD, or −VDD on respective bit lines $BL_1$, $BL_2$ and $BL_3$. The following table illustrates the bit encodings for the bit bus $T_0$, and the bit encodings for the buses $T_1$ and $T_2$ are identical to the one shown below.

| Bit Line Driver Encoding | | |
|---|---|---|
| $T_{01}$ | $T_{00}$ | Definition |
| 0 | 0 | VSS (representing 0) |
| 0 | 1 | +VDD (representing 2) |
| 1 | 0 | −VDD (representing 1) |
| 1 | 1 | FLOAT for reads |

The three voltages VSS, +VDD and −VDD comprise three possible states for a ternary representation of stored data. In the preferred embodiment, the value VSS is preferably approximately a logical ground midway between +VDD and −VDD. In the preferred embodiment +VDD and −VDD are +5 and −5 volts, respectively. The voltage generated on the respective bit line $BL_1$–$BL_3$ is used to charge a capacitor comprised in a respective DRAM cell 240–248. The bit line $BL_1$ connects to DRAM cells 240, 243, and 246; the bit line $BL_2$ connects to DRAM cells 241, 244, and 247; and the bit line $BL_3$ connects to DRAM cells 242, 245, and 248. Ternary DRAM cells 240–248 are identical to standard DRAM cells in the preferred embodiment. However, it is noted that any type of memory storage element capable of storing three states may be used, as desired.

The DRAM cells 240–248 essentially comprise a capacitor (not shown) with a pass transistor (also not shown) coupling the capacitor to the restrictive bit line $BL_1$, $BL_2$ or $BL_3$ to allow a charge to be stored onto or read from the capacitor. Since the operation of DRAM cells is well known to those skilled in the art, further details of their operation are omitted for simplicity. The pass transistor's gate in each DRAM cell is coupled to a respective word line $WL_1$–$WL_3$ which provides the row addressing for the DRAM. The word line signal $WL_1$ is coupled to each of the DRAM cells 240–242, the word line signal $WL_2$ is connected to the DRAM cells 243–245, and the word line signal $WL_3$ is connected to the DRAM cells 246–248.

A word line decoder 290 generates the three word line signals $WL_1$, $WL_2$, and $WL_3$, and these lines connect each of the respective bit lines $BL_1$, $BL_2$, and $BL_3$ to form an array. The word line decoder 290 provides the row addressing for the DRAM cells 240–248 and selects which of the DRAM cells is to be charged and is preferably identical to that in a standard DRAM as is well known in the art.

The $BL_1$, $BL_2$, and $BL_3$ signals are connected to a ternary to binary converter which includes respective sense amplifiers 250, 251, and 252 as well as a ternary to binary decoder. As discussed further below, each of the respective sense amplifiers 250-252 comprises two voltage comparators which determine whether the respective bit line is less than or greater than Vthreshold. Note: Vthreshold is chosen to enable the two voltage comparators to differentiate between the three possible voltages present on the bit line. Each of the sense amplifiers 250-252 provides an output bus comprising two bits. The sense amplifier 250 outputs a two bit bus $S_0$ comprising bits referred to as $S_{00}$ and $S_{01}$, the sense amplifier 251 outputs a two bit bus $S_1$ comprising bits referred to as $S_{10}$ and $S_{11}$, and the sense amplifier 252 outputs a two bit bus $S_2$ comprising bits referred to as $S_{20}$ and $S_{21}$. The following table illustrates the bit encodings for the sense amplifier 250 and the signal lines $S_{01}$ and $S_{00}$. The bit encodings for the sense amplifiers 251 and 252 are identical to that shown below for the sense amplifier 250.

| Sense Amplifier Encoding | | |
|---|---|---|
| Definition | $S_{01}$ | $S_{00}$ |
| VSS (representing 0) | 0 | 0 |
| +VDD (representing 2) | 0 | 1 |
| −VDD (representing 1) | 1 | 0 |
| VSS (representing 0) | 1 | 1 |

It is noted that VSS encodes into two different values 00 and 11 on each of the buses $S_0$, $S_1$, and $S_2$. Since it is only necessary for the sense amplifiers 250-252 to read three states, and the values $S_{01}$ and $S_{00}$ can represent four different possibilities, VSS was chosen to correspond to two different values on the $S_0$, $S_1$, and $S_2$ buses. Of course, alternative encodings may also be used.

The ternary to binary decoder 270 receives each of these three two bit buses, $S_0$, $S_1$, and $S_2$, from the sense amplifiers 250-252 and converts these signals into a four bit wide bus BO comprising lines $BO_0$, $BO_1$, $BO_2$, and $BO_3$. The four bit wide bus BO is the binary reconstruction of the binary data input from the binary bus $BI_3$--$BI_0$ and stored in a respective row of the ternary DRAM memory cells. The following is a VHDL description of the conversion of the three two bit buses $S_0$, $S_1$ and $S_2$ into a binary reconstruction of the original data performed by the ternary to binary decoder 270.

```
S0is0  <=  (S00 and S01) or (not S00 and not S01);
S0is1  <=  (not S00 and S01);
S0is2  <=  (S00 and not S01);
S1is0  <=  (S10 and S11) or (not S10 and not S11);
S1is1  <=  (not S10 and S11);
S1is2  <=  (S10 and not S11);
S2is0  <=  (S20 and S21) or (not S20 and not S21);
S2is1  <=  (not S20 and S21);
S2is2  <=  (S20 and not S21);
BO         <== '0000' when S2is1 and S1is1 and S0is1 else
       '0001' when S2is1 and S1is1 and S0is2 else
       '0010' when S2is1 and S1is2 and S0is1 else
       '0011' when S2is1 and S1is2 and S0is2 else
       '0100' when S2is2 and S1is1 and S0is1 else
       '0101' when S2is2 and S1is1 and S0is2 else
       '0110' when S2is2 and S1is2 and S0is1 else
       '0111' when S2is2 and S1is2 and S0is2 else
       '1000' when S2is0 and S1is1 and S0is1 else
       '1001' when S2is0 and S1is1 and S0is2 else
       '1010' when S2is0 and S1is2 and S0is1 else
       '1011' when S2is0 and S1is2 and S0is2 else
       '1100' when S2is1 and S1is1 and S0is0 else
       '1101' when S2is2 and S1is1 and S0is0 else
       '1110' when S2is1 and S1is2 and S0is0 else
       '1111' when S2is2 and S1is2 and S0is0;
```

Figure 3:
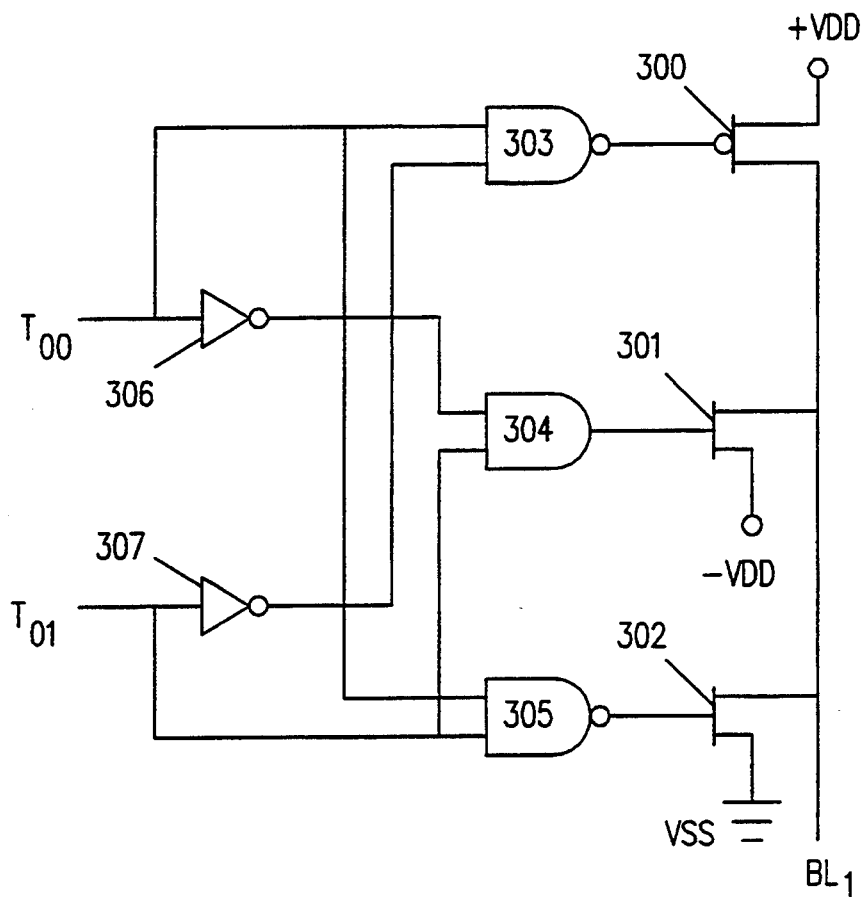
FIG. 3 illustrates the bit line driver in the ternary DRAM of FIG. 2.

Referring now to FIG. 3, bit line driver 230 is shown. The bit line driver 230 is discussed here for convenience with the following description applying equally to the bit line drivers 231 and 232. The $T_{00}$ signal is connected to an input of a two input NAND gate 303 and an input of a two input NOR gate 305. The $T_{00}$ signal is also connected to the input of an invertor 306 whose output is connected to an input of a two input AND gate 304. The $T_{01}$ signal is connected to the other inputs of the AND gate 304 and the NOR gate 305. The $T_{01}$ signal is also connected through an invertor 307 to the other input of the NAND gate 303.

The output of the NAND gate 303 is connected to the gate of a PMOS (p-channel metal oxide semiconductor) transistor. A voltage supply of +VDD is connected to the source of the PMOS transistor 300, and the drain of the transistor 300 is connected to the source of a NMOS (n-channel metal oxide semiconductor) transistor 301. The AND gate 304 is connected to the gate of the transistor 301. The voltage −VDD is connected to the drain of the transistor 301. The output of the NOR gate 305 is connected to the gate of NMOS transistor 302 whose source is connected to the drain of transistor 301 and whose drain is connected to ground. (Ground is also referred to as VSS. The circuit operates to transform the values $T_{00}$ and $T_{01}$ into corresponding values VSS, +VDD, −VDD or open, as shown.

The PMOS transistor 300 operates whereby a 0 value output from the NAND gate 303 operates to turn on the transistor 300 such that, if the transistors 301 and 302 are not turned on, the voltage +VDD is provided on the bit line $BL_1$. If the output of the NAND gate 303 is a logic 1 value, then the transistor 300 is turned off. If the output of the AND gate 304 is a logic 1 value, then the transistor 301 is turned on. If the transistors 300 and 302 are both turned off and the transistor 301 is turned on, then the voltage −VDD is present on the bit line $BL_1$. If the output of the NOR gate 305 is a logic 1 value, then the transistor 302 is turned on. If the remaining two transistors 300 and 301 are both turned off and the transistor 302 is turned on, then ground or VSS is output on the bit line $BL_1$.

As shown in FIG. 3, if the values $T_{00}$ and $T_{01}$ are both 0, then the voltage VSS is provided on bit $BL_1$. If the values for $T_{00}$ and $T_{01}$ are 1 and 0 respectively, then the voltage +VDD is output on the bit line $BL_1$. If the values $T_{00}$ and $T_{01}$ are 0 and 1 respectively, then the voltage −VDD is output on the bit line $BL_1$. If both values $T_{00}$ and $T_{01}$ have a 1 value, then all of the transistors are turned off and the bit line $BL_1$ is left floating or open.

Figure 4:
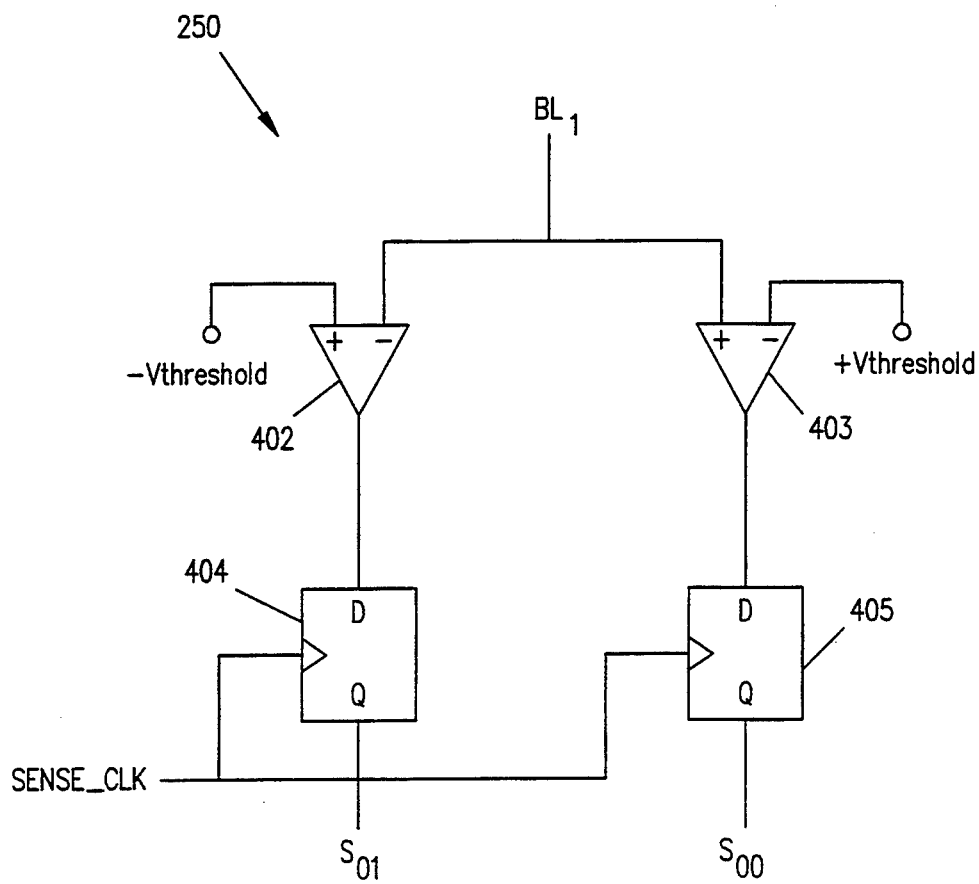
FIG. 4 illustrates a sense amplifier in the ternary DRAM of FIG. 2.

Referring now to FIG. 4, the sense amplifier 250 is shown. The sense amplifier 250 is illustrated in FIG. 4 and discussed below, and the following description applies equally well to the sense amplifiers 251 and 252. The bit line $BL_1$ is connected to the negative input of a voltage comparator 402 and the positive input of a voltage comparator 403. The positive input of voltage comparator 402 is connected to a negative reference voltage −Vthreshold, and the negative input of voltage comparator 403 is connected to a positive voltage reference Vthreshold. The output of the voltage comparator 402 is connected to the D-input of a D-type flip-flop 404 whose Q output generates the signal $S_{01}$. The output of voltage comparator 403 is connected to the D-input of a D-type flip-flop 405 whose Q output is the signal line $S_{00}$. A sense clock signal referred to as SENSE_CLK is connected to the clock input of each of the D-type flip-flops 404 and 405.

The voltage comparators 402 and 403 determine whether the respective bit line $BL_1$ is less than or greater than Vthreshold respectively. When the output of the respective comparators 402 and 403 are accurate, a read timing generator (not shown) generates the SENSE_CLK signal which causes the flip-flops 404 and 405 to latch in the outputs of the respective voltage comparators 402 and 403 and provide these outputs as the $S_{01}$ and $S_{00}$ signals, respectively.

Therefore, a method and apparatus for using a ternary representation of data in standard DRAM cells is shown. In a preferred embodiment, a four bit binary number can be stored using only three ternary DRAM cells, resulting in a 33% storage density increase. This allows the use of existing DRAM while considerably increasing the DRAM's memory storage density. The ternary storage memory apparatus includes a binary to ternary converter which receives a first number of binary bits of data during a write operation and generates a second lesser number of data values or voltages using a ternary representation. A plurality of rows comprising a second number of memory storage elements 240-248 are coupled to the binary to ternary converter and store the respective voltages using the above ternary representation. During reads, a ternary to binary converter converts these voltages into the original binary representation.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A ternary semiconductor storage memory for storing data during write operations and outputting data during read operations, comprising:
    a binary to ternary converter which receives a first number of binary data bit values during a write operation and generates a second number of ternary data bit values using a ternary representation, wherein said second number is less than said first number;
    a plurality of semiconductor memory storage elements coupled to said binary to ternary converter which stores said second number of ternary data bit values using said ternary representation; and
    a ternary to binary converter coupled to said plurality of semiconductor memory storage elements which reads said second number of ternary data bit values using said ternary representation and outputs said first number of binary data bit values during a read operation.

2. The ternary semiconductor storage memory of claim 1, wherein said binary to ternary converter comprises:
    a binary to ternary encoder which receives said first number of binary data bit values during said write operation and generates a second number of two-bit values which encode a ternary representation of said binary bits of data; and
    a plurality of bit line drivers coupled between said binary to ternary encoder and said plurality of semiconductor memory storage elements, wherein said bit line drivers receive said second number of two-bit values, convert said second number of two-bit values into said second number of ternary data bit values, mad store said ternary data bit values into said semiconductor memory storage elements.

3. The ternary semiconductor storage memory of claim 1, wherein said ternary to binary converter comprises:
    a plurality of sense amplifiers coupled to said plurality of semiconductor memory storage elements, wherein said sense amplifiers receive said second number of ternary data bit values using said ternary representation and output a second number of two-bit values; and
    a ternary to binary decoder coupled to said plurality of sense amplifiers which receives said second number of two-bit values and converts said second number of two-bit values into said first number of binary data bit values.

4. The ternary semiconductor storage memory of claim 1, wherein each of said second number of ternary data bit values using said ternary representation may comprise one of three values.

5. The ternary semiconductor storage memory of claim 1, wherein each of said second number of ternary data bit values using said ternary representation may comprise either a positive voltage value, a negative voltage value, or a voltage approximately equal to ground.

6. The ternary semiconductor storage memory of claim 1, wherein said semiconductor memory storage elements comprise dynamic random access memory.

7. The ternary semiconductor storage memory of claim 1, wherein said first number is four and said second number is three.

8. A semiconductor memory system with increased storage density, comprising:
    a first converter which receives a first number of data values using a first representation of data during a write operation and generates a second number of data bit values using a second representation of data;
    a plurality of semiconductor memory storage elements coupled to said first converter which stores said second number of data bit values using said second representation of data; and
    a second converter coupled to said plurality of semiconductor memory storage elements which reads said second number of data bit values using said second representation of data and outputs said first number of data values using said first representation of data during a read operation.

9. The semiconductor memory system of claim 8, wherein each of said first number of data values using said first representation of data has one of a first number of states; and wherein each of said second number of data values using said second representation of data has one of a second number of states.

10. The semiconductor memory system of claim 9, wherein said second number is greater than said first number.

11. The semiconductor memory system of claim 9, wherein said first number is greater than said second number.

12. A ternary semiconductor storage memory for storing data during write operations and outputting data during read operations, comprising:
- a binary to ternary encoder which receives a first number of binary data bit values during a write operation and generates a second number of two-bit values which encode a ternary representation of said binary bits of data;
- a plurality of bit line drivers coupled to said binary to ternary encoder wherein said bit line drivers receive said second number of two-bit values and convert said second number of two-bit values into a second number of ternary data bit values;
- a plurality of semiconductor memory storage elements coupled to said plurality of bit line drivers which store said second number of ternary data bit values using said ternary representation;
- a plurality of sense amplifiers coupled to said plurality of semiconductor memory storage elements, wherein said sense amplifiers receive said second number of ternary data bit values and output a second number of two-bit values; and
- a ternary to binary decoder coupled to said plurality of sense amplifiers which receives said second number of two-bit values and converts said second number of two-bit values into said first number of binary data bit values.

13. The semiconductor ternary storage memory of claim 13, wherein said first number is four and said second number is three.

* * * * *